(12) United States Patent
Jung et al.

(10) Patent No.: US 10,541,161 B2
(45) Date of Patent: Jan. 21, 2020

(54) APPARATUS AND METHOD FOR TREATING SUBSTRATE

(71) Applicant: SEMES CO., LTD., Chungcheongnam-do (KR)

(72) Inventors: Younghun Jung, Chungcheongnam-do (KR); Choongki Min, Chungcheongnam-do (KR); Soo Hyun Cho, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/627,618

(22) Filed: Jun. 20, 2017

(65) Prior Publication Data
US 2017/0372922 A1     Dec. 28, 2017

(30) Foreign Application Priority Data
Jun. 24, 2016   (KR) .................. 10-2016-0079248

(51) Int. Cl.
*H01L 21/027*   (2006.01)
*H01L 21/67*    (2006.01)
*B05D 1/36*     (2006.01)

(52) U.S. Cl.
CPC ............ *H01L 21/6715* (2013.01); *B05D 1/36* (2013.01); *H01L 21/67017* (2013.01)

(58) Field of Classification Search
CPC ..... H01L 21/67; H01L 21/02; H01L 21/6715; H01L 21/67017; H01L 21/02052; H01L 21/024; H01L 21/67051; H01L 21/027; H01L 21/0274; H01L 21/461; H01L 21/308; H01L 21/0271; H01L 21/02126; H01L 21/02343; H01L 21/3105;
(Continued)

(56) References Cited

U.S. PATENT DOCUMENTS

| 2009/0169758 A1* | 7/2009 | Ryu ..................... G03F 7/162 427/427.3 |
| 2010/0093183 A1* | 4/2010 | Kim .................... H01L 21/6715 438/759 |

(Continued)

FOREIGN PATENT DOCUMENTS

| KR | 10-1999-0023710 A | 3/1999 |
| KR | 10-2000-0062513 A | 10/2000 |

(Continued)

*Primary Examiner* — Chuong A Luu
(74) *Attorney, Agent, or Firm* — Li & Cai Intellectual Property (USA) Office

(57) ABSTRACT

Provided is a substrate treating apparatus. The substrate treating apparatus comprises: a support unit provided to support the substrate and rotate the substrate; a treatment liquid nozzle for supplying the treatment liquid onto the substrate supported by the support unit; a pre-wet liquid nozzle for supplying a pre-wet liquid onto a substrate supported by the support unit; and a controller for controlling the treatment liquid nozzle and the pre-wet liquid nozzle, wherein the controller controls the treatment liquid nozzle and the pre-wet liquid nozzle to perform a pre-wet step for supplying the pre-wet liquid to the substrate, and then a treatment liquid supply step for supplying the treatment liquid to the substrate and supplying the pre-wet liquid to the substrate during the supplying the treatment liquid to the substrate.

10 Claims, 9 Drawing Sheets

(58) Field of Classification Search
CPC ....... H01L 21/02359; B08B 3/10; B08B 3/08;
B08B 3/02; B08B 3/024
USPC ........................................................ 438/758
See application file for complete search history.

(56) References Cited

U.S. PATENT DOCUMENTS

| | | | |
|---|---|---|---|
| 2011/0226626 A1* | 9/2011 | Choi | C25D 17/06 205/93 |
| 2016/0161867 A1* | 6/2016 | Yoshida | H01L 21/02104 355/30 |

FOREIGN PATENT DOCUMENTS

| | | |
|---|---|---|
| KR | 10-2004-0082185 A | 9/2004 |
| KR | 10-06663570000 B | 1/2007 |
| KR | 10-2009-0005982 A | 1/2009 |
| KR | 10-2012-0075419 A | 7/2012 |
| KR | 10-2014-0143148 A | 12/2014 |
| KR | 10-2015-0027669 A | 3/2015 |
| KR | 10-2016-0071330 A | 6/2016 |

\* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0079248 filed Jun. 24, 2016, in the Korean Intellectual Property Office, the entire contents of which are hereby incorporated by reference.

BACKGROUND OF THE INVENTION

The present invention disclosed herein relates to an apparatus and method for treating a substrate with a liquid.

In a method for manufacturing a semiconductor device, various processes such as cleaning, deposition, photolithography, etching, and ion implantation are performed.

A photo-lithography process in a semiconductor manufacturing process is a process of forming a desired pattern on a wafer. The photolithography process is usually carried out in a spinner local facility where exposure equipment is connected to continuously process the coating, exposure, and development processes. The spinner apparatus sequentially or selectively performs a HMDS (hexamethyl disilazane) process, a photoresist coating process, a baking process, and a development process. Here, the photoresist coating process is a process of coating a photoresist liquid such as photoresist (PR) to the surface of the substrate.

In addition, a spin-on hard mask (SOH) process is used as a process for forming a film on a substrate in a semiconductor manufacturing process. A spin-on hard mask (SOH) process is a process of forming a liquid film by supplying a chemical to the center of a substrate.

In the case of such a photosensitive liquid coating process or a chemical supply process, in order to facilitate the diffusion of the treatment liquid such as a photoresist or a chemical on the substrate to treat the substrate with a relatively small amount of the treatment liquid, a pre-wet process for supplying a pre-wet liquid such as a thinner onto the substrate is performed before supplying the process liquid.

Generally, the treatment liquid and the pre-wet liquid are supplied to the center of the substrate to be rotated. Therefore, after the pre-wet process is performed, the pre-wet liquid in the edge region of the substrate may be dried and tearing may occur in the film of the coated treatment liquid while the treatment liquid is being supplied onto the substrate. Further, there is a problem that a larger amount of the treatment liquid is required to be supplied in order to prevent such a tearing phenomenon.

SUMMARY OF THE INVENTION

Embodiments of the inventive concept described herein relate to an apparatus and a method that may prevent the tearing phenomenon of a film of a treatment liquid coated onto a substrate.

Embodiments of the inventive concept described herein relate to an apparatus and a method for reducing the amount of the treatment liquid used.

The objects of the inventive concept are not limited to the above mentioned effects. Other objects thereof will be understandable by those skilled in the art from the following descriptions.

An embodiment of the inventive concept provides a substrate treating apparatus. The substrate treating apparatus comprises: a support unit provided to support the substrate and rotate the substrate; a treatment liquid nozzle for supplying the treatment liquid onto the substrate supported by the support unit; a pre-wet liquid nozzle for supplying a pre-wet liquid onto a substrate supported by the support unit; and a controller for controlling the treatment liquid nozzle and the pre-wet liquid nozzle, wherein the controller controls the treatment liquid nozzle and the pre-wet liquid nozzle to perform a pre-wet step for supplying the pre-wet liquid to the substrate, and then a treatment liquid supply step for supplying the treatment liquid to the substrate and supplying the pre-wet liquid to the substrate during the supplying the treatment liquid to the substrate.

In example embodiments, the controller, in the treatment liquid supply step, controls the treatment liquid nozzle and the pre-wet liquid nozzle so that the supply of the pre-wet liquid stops before the treatment liquid reaches the point on the substrate to which the pre-wet liquid is supplied.

In example embodiments, the controller, in the treatment liquid supply step, controls the treatment liquid nozzle and the pre-wet liquid nozzle so that the supply timing of the treatment liquid and the pre-wet liquid are the same.

In example embodiments, the controller, in the treatment liquid supply step, controls the treatment liquid nozzle and the pre-wet liquid nozzle so that the pre-wet liquid is supplied to the substrate before the treatment liquid.

In example embodiments, the controller, in the treatment liquid supply step, controls the treatment liquid nozzle and the pre-wet liquid nozzle so that the position where the pre-wet liquid is supplied onto the substrate is located farther from the center of the substrate than the position where the treatment liquid is supplied onto the substrate.

In example embodiments, the pre-wet liquid nozzle comprises: a first pre-wet liquid nozzle for supplying the pre-wet liquid to a substrate in the pre-wet step; and a second pre-wet liquid nozzle for supplying the pre-wet liquid to the substrate in the treatment liquid supply step.

In example embodiments, the first pre-wet liquid nozzle and the process liquid nozzle may be installed in a first nozzle arm.

In example embodiments, the second pre-wet liquid nozzle may be installed on the second nozzle arm, and the first nozzle arm and the second nozzle arm may be provided to move independently of each other.

In example embodiments, the plurality of treatment liquid nozzles may be provided, and the second pre-wet liquid nozzle may be provided between the treatment liquid nozzles.

In example embodiments, the second pre-wet liquid nozzle may be installed in the first nozzle arm.

In example embodiments, the plurality of treatment liquid nozzles may be provided, some of the treatment liquid nozzles may be provided between the first pre-wet liquid nozzles and the second pre-wet liquid nozzle, and the others of the treatment liquid nozzle may be provided at a position opposite to a position where the second pre-wet liquid nozzle is installed with respect to the first pre-wet liquid nozzle.

An embodiment of the inventive concept provides a substrate treating method. The substrate treating method comprises: a pre-wet step for supplying a pre-wet liquid to the substrate; and then a treatment liquid supply step for supplying a treatment liquid to the substrate and supplying a pre-wet liquid to the substrate during the supplying the treatment liquid to the substrate.

In example embodiments, in the treatment liquid supply step, the supply of the pre-wet liquid stops before the treatment liquid reaches the point on the substrate to which the pre-wet liquid is supplied.

In example embodiments, in the treatment liquid supply step, the supply timing of the treatment liquid and the pre-wet liquid are the same.

In example embodiments, in the treatment liquid supply step, the pre-wet liquid is supplied to the substrate before the treatment liquid.

In example embodiments, in the treatment liquid supply step, the supply of the pre-wet liquid may be completed before the supply of the treatment liquid.

In example embodiments, in the treatment liquid supply step, the supply of the pre-wet liquid and the supply of the treatment liquid may be completed at the same time.

In example embodiments, in the treatment liquid supply step, the position where the pre-wet liquid is supplied onto the substrate is a position farther from the center of the substrate than the position where the treatment liquid is supplied onto the substrate.

In example embodiments, in the treatment liquid supply step, the treatment liquid may be supplied to a central region of the substrate, and the pre-wet liquid may be supplied to an edge region of the substrate.

In example embodiments, in the pre-wet step, the pre-wet liquid may be supplied to the central region of the substrate.

In example embodiments, a photo-resist may be provided as the treatment liquid, and a thinner may be provided as the pre-wet liquid.

According to an embodiment, the apparatus and method of the present invention may prevent the film of the treatment liquid coated on the substrate from being torn.

According to an embodiment, the apparatus and method of the present invention may reduce the amount of treatment liquid used.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

The equipment of this embodiment can be used to perform a photolithography process on a substrate such as a semiconductor wafer or a flat panel display panel. In particular, the equipment of this embodiment can be used to perform a coating process and a developing process for a substrate, which is connected to an exposure apparatus. Hereinafter, a case where a wafer is used as a substrate will be described as an example.

Figure 1:
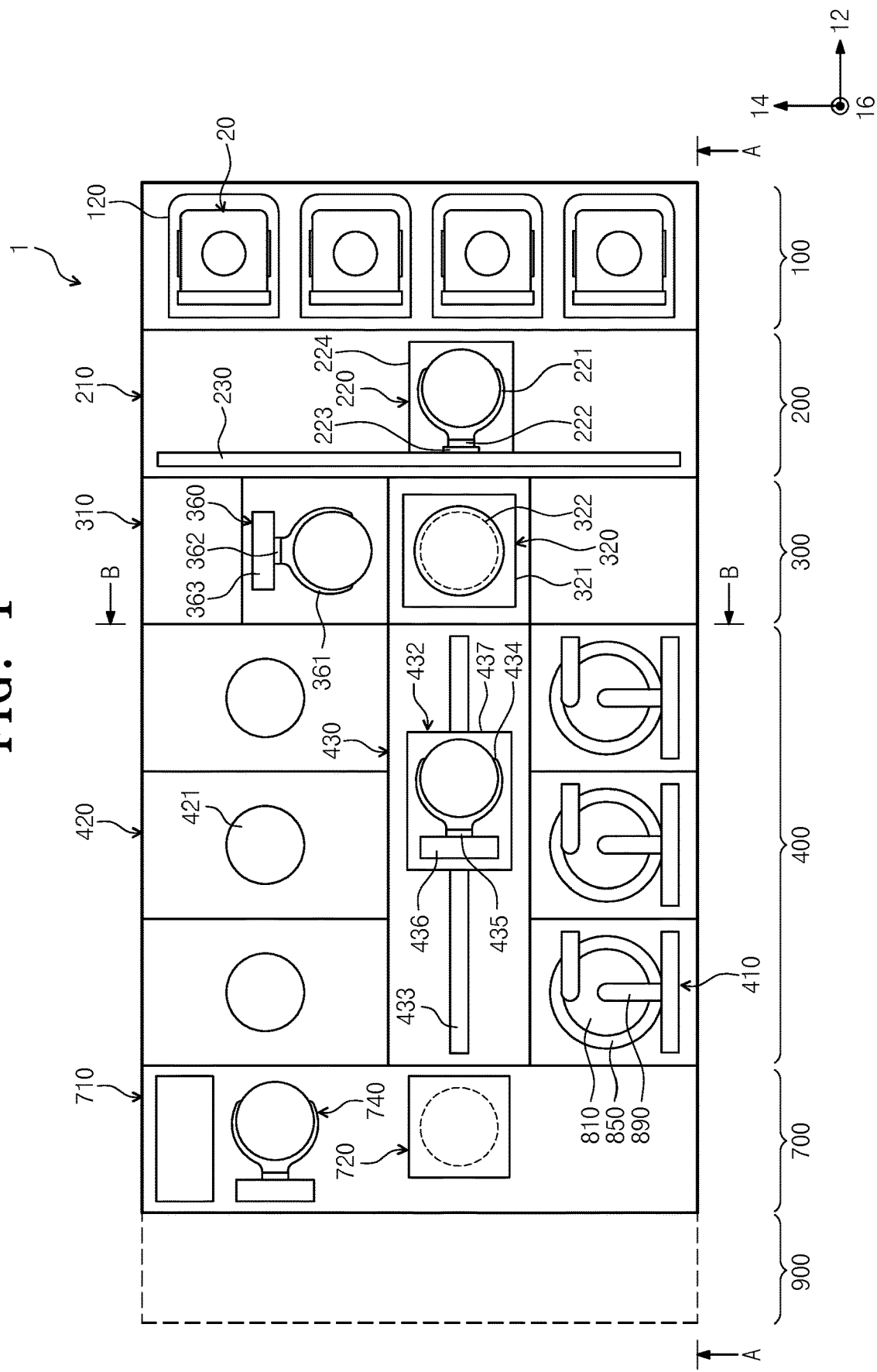
FIG. 1 is a top view of a substrate treating equipment.
Figure 2:
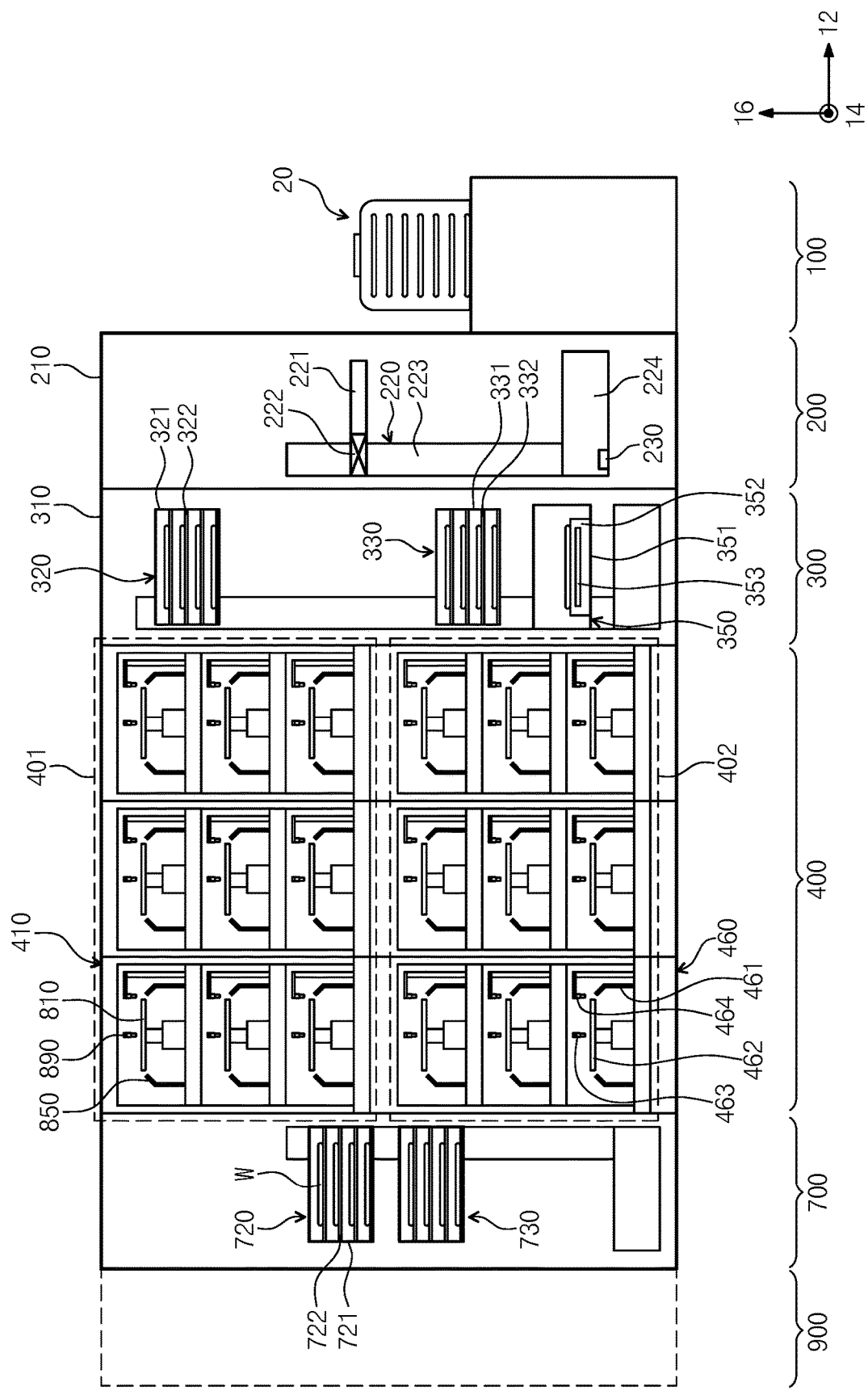
FIG. 2 is a view of the equipment of FIG. 1 viewed from A-A direction.
Figure 3:
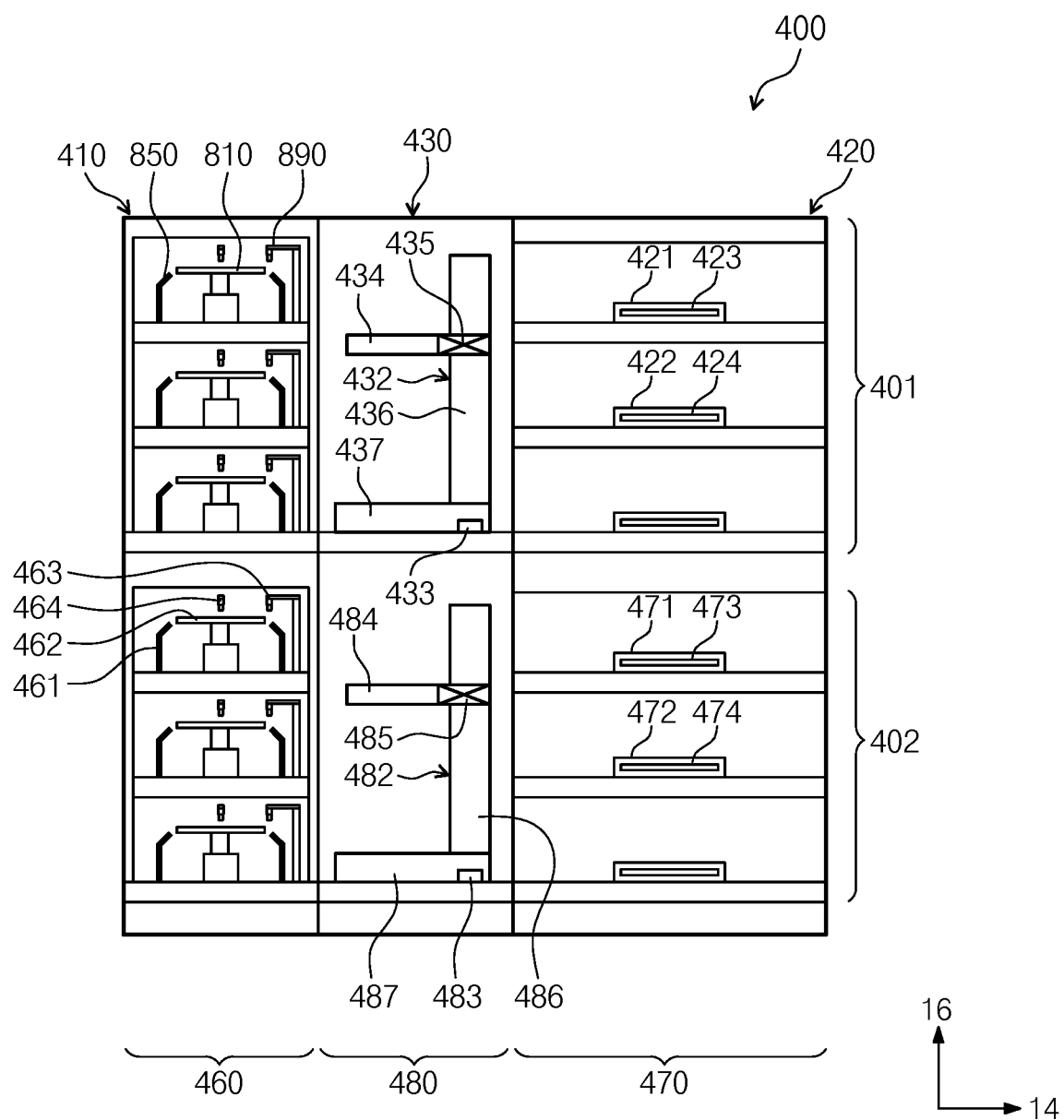
FIG. 3 is a view of the equipment of FIG. 1 viewed from B-B direction.

FIG. 1 is a top view of a substrate treating equipment. FIG. 2 is a view of the a equipment of FIG. 1 viewed from A-A direction. FIG. 3 is a view of the equipment of FIG. 1 viewed from B-B direction.

Referring to FIGS. 1 to 3, a substrate treating equipment 1 comprises a load port 100, an index module 200, a buffer module 300, a coating and developing module 400, and an interface module 700. The load port 100, the index module 200, the buffer module 300, the coating and developing module 400 and the interface module 700 are sequentially arranged along one direction.

Hereinafter, a direction where the load port 100, the index module 200, the buffer module 300, the coating and developing module 400, and the interface module 700 are arranged will be referred to as a first direction 12, a direction that is perpendicular to the first direction when viewed from the top will be referred to as a second direction 14, and a direction perpendicular to each of the first direction 12 and the second direction 14 will be referred to as a third direction 16.

A substrate W moves as received within a cassette 20. The cassette 20 has a sealed structure from outside. In an example, as the cassette 20, a Front Open Unified Pod (FOUP) having a door in front thereof may be used.

The load port 100, the index module 200, the buffer module 300, the coating and developing module 400, and the interface module 700 will be described in detail below.

The load port 100 has a placement table 120 where it places a cassette 20 in which substrates W are received. The placement table 120 may be provided with plural numbers and the pluralities of placement tables 200 are arranged in a row along the second direction 14. FIG. 1 illustrates only four placement tables 120 as an example.

The index module 200 transfers substrate W between buffer module 300 and cassette 20 placed in the placement table 120 of the road port 100. The index module 200 includes a frame 210, an index robot 220, and a guide rail 230. The frame 210 is provided as rectangular shape where internal is generally empty, and placed in between the buffer module 300 and the load port 100. The frame 210 of the index module 200 may be provided having lower height than a frame 310 of the buffer module 300 which will be described later. The index robot 220 and the guide rail 230 are arranged within the frame 210. The index robot 220 is provided with a structure that may drive four axles so that a hand 221 directly handles the substrate W to move and rotate to the first direction 12, the second direction 14, and the third direction 16. The index robot 220 includes a hand 221, an arm 222, a supporter 223, and a pedestal 224. The hand 221 is fixedly installed on the arm 222. The arm 222 is provided as expandable and contractible structure and rotatable structure. The supporter 223 is arranged such that the lengthwise direction thereof is parallel with third direction. The arm 222 is movably connected to the supporter 223 such that the arm 22 moves along the supporter 223. The supporter 223 is fixedly connected to the pedestal 224. The guide rail 230 is arranged such that the lengthwise direction thereof is parallel with the second direction 14. The pedestal 224 is movably connected to the guide rail 230, moving linearly along the guide rail 230. Also, although it is not shown, the frame 210 is further provided with a door opener that opens and closes the cassette 20 door.

The buffer module 300 includes a frame 310, a first buffer 320, a second buffer 330, a cooling chamber 350, and a buffer robot 360. The frame 310 is provided as a rectangular shape with empty internal, and is arranged between the index module 200 and the coating and developing module 400. The first buffer 320, the second buffer 330, the cooling chamber 350, and the buffer robot 360 are placed within the frame 310. The cooling chamber 350, the second buffer 330, and the first buffer 320 are sequentially arranged along the third direction 16 starting from a bottom. The first buffer 320 is located at a height corresponding to a height of the coating module 401 of the coating and developing module 400 which will be described later, and the second buffer 330 and the cooling chamber 350 are provided at a height corresponding to a height of the developing module 402 of the coating and developing module 400 which will be described later. The buffer robot 360 is separately positioned with the second buffer 330, the cooling chamber 350, and the first buffer 320 along the second direction 14 with a certain distance.

Each of the first buffer 320 and the second buffer 330 temporarily keeps a plurality of substrates W. The second buffer 330 has a housing 331 and a plurality of supporters 332. The supporters 332 are placed within the housing 331, and are spaced apart from each other along with the third direction 16. One substrate W is placed on each supporter 332. The housing 331 has an opening (not shown) on the direction where the index robot 220 is provided, on the direction where the buffer robot 360 is provided, and on the direction where the developing robot 482 is provided such that the index robot 220, the buffer robot 360, and a developing robot 482 of the developing module 402 which will be described later bring or take the substrates W in or out of the supporter 332 within the housing 331. The first buffer 320 generally has a similar structure to the second buffer 330. The difference is that in the first buffer 120, a housing 321 has an opening on the direction where the buffer robot 360 is provided and on the direction where a coating robot 432 located on a coating module 401 is provided. The number of supporter 322 provided on the first buffer 320 and the number of supporter 332 on the second buffer 330 may be the same or different. According to an example embodiment, the number of supporter 332 provided on the second buffer 330 may be larger than the number of supporter 332 provided on the first buffer 320.

The buffer robot 360 transfers the substrate W in between the first buffer 320 and the second buffer 330. The buffer robot 360 includes a hand 361, an arm 362, and a supporter 363. The hand 361 is fixedly installed on the arm 362. The arm 362 is provided as expandable and contractible structure so that the hand 361 may move along the second direction 14. The arm 362 is movably connected to supporter 363 and moves linearly along the supporter 363 in the third direction 16. The supporter 363 may have a length extending from a point corresponding to the second buffer 330 and to a point corresponding to the first buffer 320. The supporter 363 may be provided longer than this extending upward or downward. The buffer robot 360 may be provided such that the hand 361 has only two axle drive along the second direction 14 and the third direction 16.

Each of the cooling chamber 350 cools a substrate W. The cooling chamber 350 includes a housing 350 and a cooling plate 352. The cooling plate 352 has an upper surface where the substrate W places and a cooling system 353 that cools the substrate W. The cooling system 353 utilizes various cooling methods such as cooling by cooling water or cooling by thermoelectric element. Also, the cooling chamber 350 may be provided with a lift pin assembly that places the substrate W on a cooling plate 352. The housing 351 has an opening (not shown) on a direction where the index robot 220 is provided and on a direction where the developing robot 482 is provided such that the developing robot 482 provided on the index robot 220 and the developing module 402 bring or take the substrate W in or out of the cooling plate 352. Also, the cooling chamber 350 is provided with doors (not shown) that open and close the above-described opening.

The coating and developing module 400 performs a coating process that coats a photoresist on a substrate W before exposure process and a developing process that develops the substrate W after exposure process. Generally the coating and developing module 400 has a rectangular shape. The coating and developing module 400 has a coating module 401 and a developing module 402. The coating module 401 and the developing module 402 are arranged vertically as a separate layer. According to an example, the coating module 401 is placed on top of the developing module 402.

The coating module 401 performs a coating process that coats photoresist on a substrate W and a heat treatment process such as heating and cooling the substrate W before and after resist coating process. The coating module 401 includes a resist coating chamber 410, a bake chamber 420, and a transfer chamber 430. The resist coating chamber 410, the bake chamber 420, and the transfer chamber 430 are sequentially arranged along the second direction 14. Therefore, the resist coating chamber 410 and the bake chamber 420 are positioned separately each other along the second direction 14 with interposing the transporting chamber 430 there between. A plurality of the resist coating chambers 410 are provided along the first direction 12 and the third direction 16, respectively. A plurality of bake chambers 420 are provided along the first direction 12 and the third direction 16, respectively.

The transfer chamber 430 is arranged in a line with the first buffer 320 of the buffer module 300 in the first direction 12. Within the transfer chamber 430, a coating unit robot 432 and a guide rail 433 are positioned. Generally the transfer chamber 430 has a rectangular shape. The coating unit robot 432 transfers the substrate W between bake chambers 420, resist coating chambers 400, and the first buffer 320 of the buffer module 300. The guide rail 433 is arranged such that its lengthwise direction is parallel with the first direction 12. The guide rail 433 guides the coating unit robot 432 to move linearly in the first direction 12. The coating unit robot 432 includes a hand 434, an arm 435, a supporter 436, and a pedestal 437. The hand 434 is fixedly installed on the arm 435. The arm 435 is provided as expandable and contractible structure, and thereby the hand 434 may move in horizontal direction. The supporter 436 is arranged such that the lengthwise direction thereof is parallel with the third direction 16. The arm 435 is connected to the supporter 436 so that the arm 435 may move linearly along the supporter 436 in the third direction 16. The supporter 436 is fixedly connected to the pedestal 437 and the pedestal 437 is connected to the guide rail 433 to move along the guide rail 433.

Figure 4:
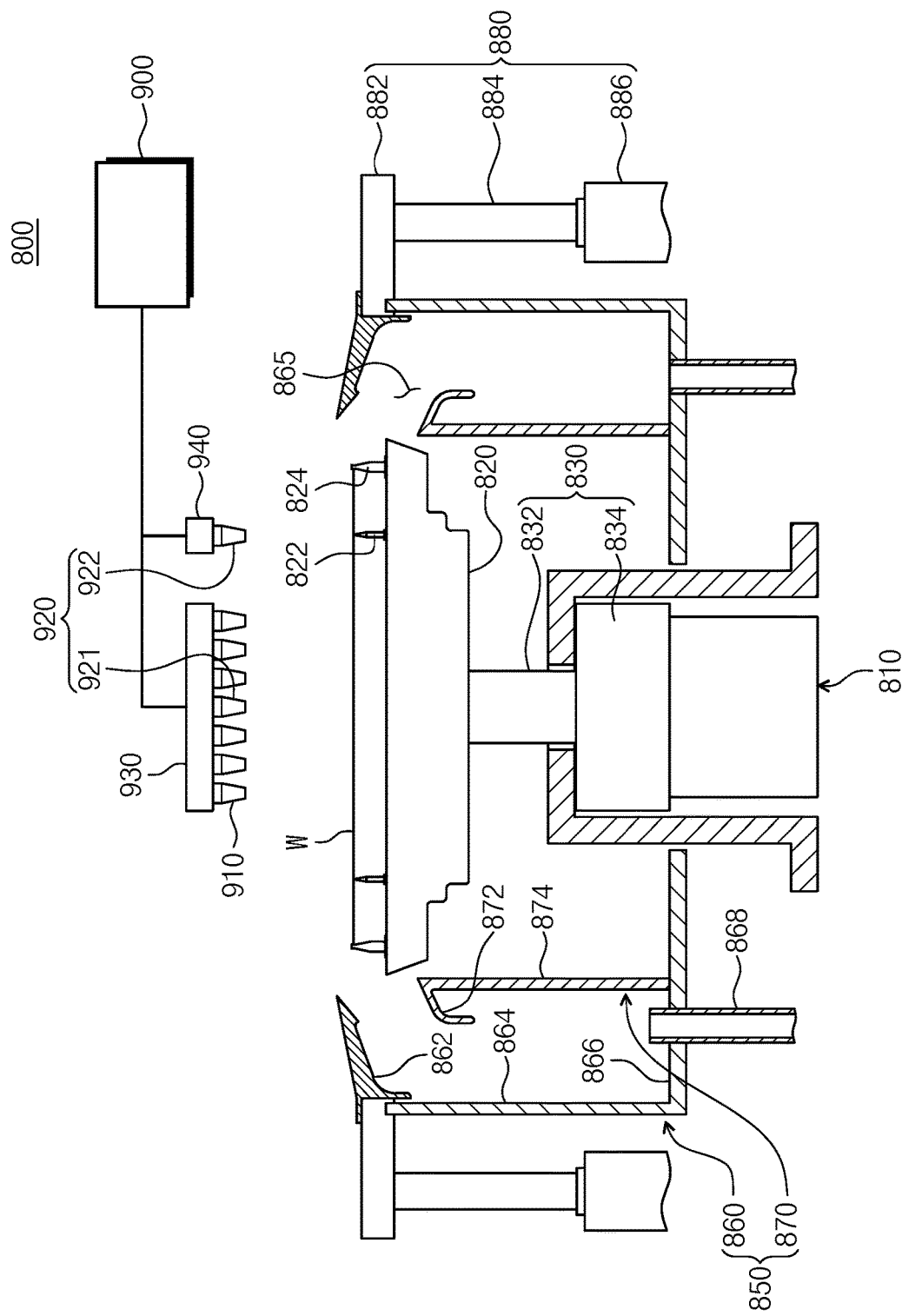
FIG. 4 is a cross-sectional view showing a substrate treating apparatus provided in the coating chamber of FIG. 1.

All resist coating chambers 410 have the same structures. But sorts of photoresist used in each of resist coating chamber 410 may be different from each other. In an example, a chemical amplification resist may be used as a photoresist. The resist coating chamber 410 is provided as an apparatus for treating a substrate for coating photoresist on a substrate W. FIG. 4 is a cross-sectional view showing a substrate treating apparatus provided in the coating chamber of FIG. 1. Referring to FIG. 4, a substrate treating apparatus 800 comprises a housing 850, a support unit 810, an elevator unit 880, a treatment liquid nozzle 910, a pre-wet nozzle 920, and a controller 900.

The housing 850 has a treating space in which a coating process is performed. The housing 850 is provided in a cylindrical shape with its top opened. The housing 850 includes a collecting container 860 and a guide wall 870. The collecting container 860 is provided in an annular ring shape surrounding the support unit 810. The guide wall 870 is provided in the shape of an annular ring surrounding the support unit 810 inside the collecting container 860. The space between the collecting container 860 and the guide wall 870 provides the collecting space 865 where the treatment liquid is recovered. A collecting line 868 is connected to the bottom of the collecting container 860. The collecting line 868 discharges the treatment liquid introduced into the collecting container 860 to the outside. The discharged treatment liquid can be reused through a treatment liquid regeneration system (not shown).

The collecting container 860 includes a first inclined wall 862, a vertical wall 864, and a bottom wall 866. The first inclined wall 862 is provided so as to surround the support unit 810. The first inclined wall 862 is provided so as to be inclined downward in a direction away from the support unit 810. The vertical wall 864 extends perpendicular to the ground from the lower end of the first inclined wall 862 downward. The bottom wall 866 extends horizontally from the lower end of the vertical wall 864 toward the central axis of the support unit 810.

The guide wall 870 is positioned between the first inclined wall 862 and the bottom wall 866. The guide wall 870 includes a second inclined wall 872 and a side wall 874. The second inclined wall 872 is provided so as to surround the support unit 810. The second inclined wall 872 is provided so as to be inclined downward in a direction away from the support unit 810. The upper end of the second inclined wall 872 and the upper end of the first inclined wall 862 is provided vertically to each other. The side wall 874 extends vertically downward from the upper end of the second inclined wall 872. The side wall 874 connects the second inclined wall 872 and the bottom wall 866.

The support unit 810 supports and rotates the substrate within the housing 850. The support unit 810 includes a support plate 820 and a drive member 830. On the upper surface of the support plate 820, pin members 822 and 824 for supporting the substrate are coupled. Support pins 822 support the bottom surface of the substrate, and chuck pins 824 support the sides of the substrate. The support plate 820 is rotatable by the driving member 830. The driving member 830 includes a driving shaft 832 and a driver 834. The drive shaft 834 is coupled to the bottom surface of the support plate 820. The driver 834 provides rotational force to the drive shaft 832. For example, the driver 834 may be a motor.

The elevator unit 880 elevates the housing 850 vertically and adjusts the relative height between the housing 850 and the support unit 810. The elevator unit 880 includes a bracket 882, a moving shaft 884, and a driver 886. The bracket 882 is fixed to the inclined wall of the housing 850. A moving shaft 884, which is vertically moved by a driver 886, is fixedly coupled to the bracket 882.

Figure 5:
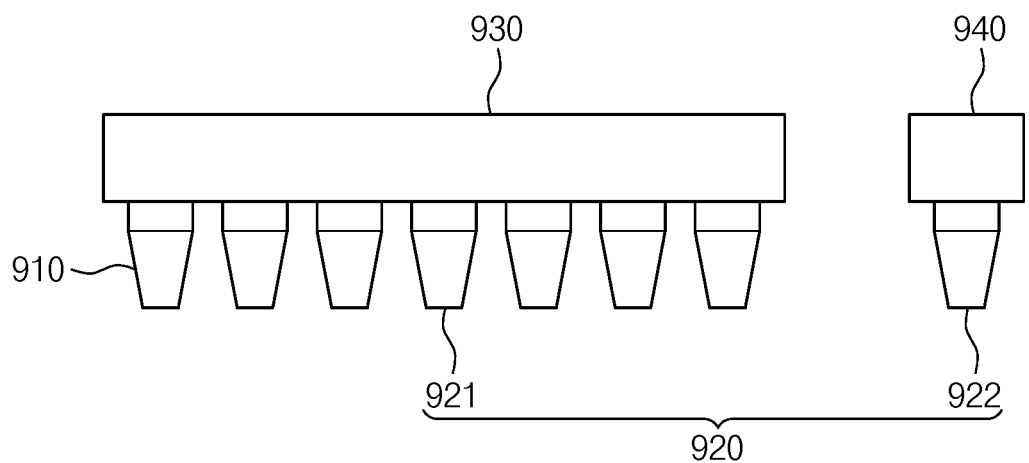
FIG. 5 is a view showing the treatment liquid nozzle and the pre-wet liquid nozzle of FIG. 4.

FIG. 5 is a view showing the treatment liquid nozzle and the pre-wet liquid nozzle of FIG. 4. Referring to FIGS. 4 and 5, the treatment liquid nozzle 910 supplies the treatment liquid onto the substrate W supported by the support unit 810. The treatment liquid may be a sensitizing solution such as a photoresist.

The pre-wet liquid nozzle 920 supplies the pre-wet liquid onto the substrate W supported by the support unit 810. A thinner may be provided as the pre-wet liquid. According to one embodiment, the pre-wet liquid nozzle 920 includes a first pre-wet liquid nozzle 921 and a second pre-wet liquid nozzle 922.

The first pre-wet liquid nozzle 921 supplies the pre-wet liquid to the substrate W in the pre-wet step S10 of the substrate treating method to be described later. The second pre-wet liquid nozzle 922 supplies the pre-wet liquid to the substrate W in the treatment liquid supply step (S20) of the substrate treating method to be described later.

The first pre-wet liquid nozzle 921 and the treatment liquid nozzle 910 may be installed in the first nozzle arm 930 and the second pre-wet liquid nozzle 922 may be installed in the second nozzle arm 940. The first nozzle arm 930 and the second nozzle arm 940 are provided to move independently of each other. A plurality of treatment liquid nozzles 910 is provided. A second pre-wet liquid nozzle 922 may be provided between the treatment liquid nozzles. When a plurality of treatment liquid nozzles 910 are provided, the treatment liquid is ejected from one of the plurality of treatment liquid nozzles 910 when the treatment liquid is supplied onto the substrate W. Alternatively, the process treatment nozzle and the pre-wet liquid nozzle may be provided in various forms.

Figure 6:
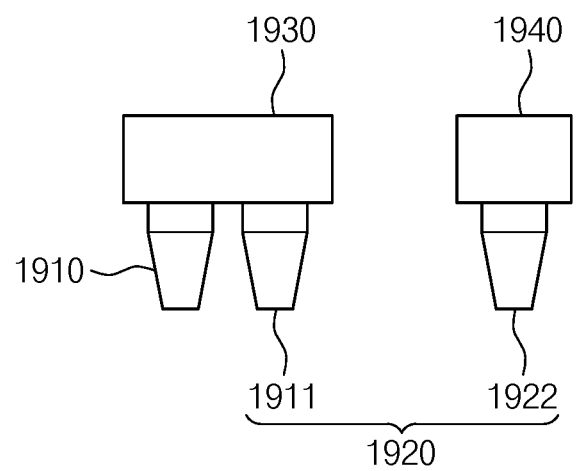
FIGS. 6 to 8 are views showing a treatment liquid nozzle and a pre-wet liquid nozzle according to different embodiments, respectively.
Figure 7:
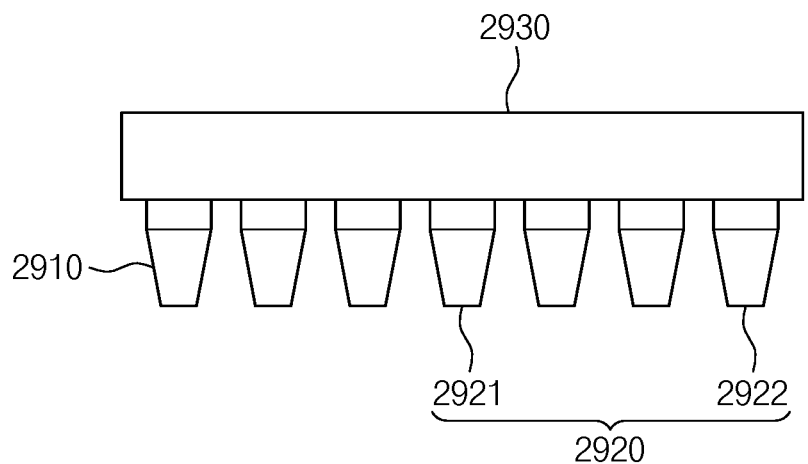
Figure 8:
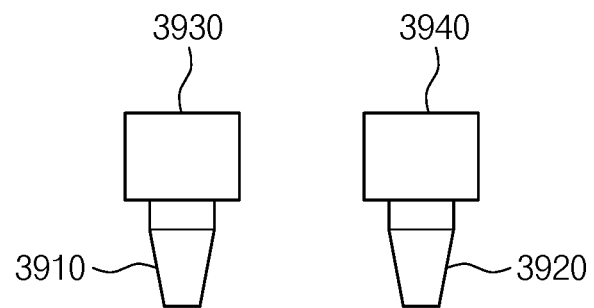

For example, FIGS. 6 to 8 are views showing a treatment liquid nozzle and a pre-wet liquid nozzle according to different embodiments, respectively.

Referring to FIG. 6, unlike the FIG. 5, one treatment liquid nozzle 1910 is installed in the first nozzle arm 1930. In this case, the treatment liquid nozzle 1910 is detachably provided from the first nozzle arm 1930. Therefore, the treatment liquid nozzle 1910 other than the treatment liquid nozzle 1910 attached to the first nozzle arm 1930 waits at a home port (Not shown) in which cleaning and static elimination with respect to the treatment liquid nozzle 1910 are performed. Therefore, the treatment liquid nozzle 1910 attached to the first nozzle arm 1930 may be replaced with a treatment liquid nozzle 1910 waiting at the home port, if necessary.

Referring to FIG. 7, unlike the FIGS. 5 and 6, the treatment liquid nozzle 2910, the first pre-wet liquid nozzle 2921 and the second pre-wet liquid nozzle 2922 are installed in the first nozzle arm 2930. In this case, some of the plurality of treatment liquid nozzles 2910 is provided between the first pre-wet liquid nozzle 2921 and the second pre-wet liquid nozzle 2922. The others of the treatment liquid nozzle 2910 is provided at a position opposite to the position where the second pre-wet liquid nozzle 2922 is installed with respect to the first pre-wet liquid nozzle 2921. The other structure, function, and structure of the substrate treating apparatuses are the same as or similar to those in FIG. 5.

Referring to FIG. 8, unlike the FIGS. 5 to 7, one pre-wet liquid 3920 nozzle is provided. In this case, the treatment liquid nozzle 3910 is installed in the first nozzle arm 3930, and the pre-wet liquid nozzle 3920 is installed in the second nozzle arm 3940. Therefore, in the pre-wet step S10 and the process liquid supply step S20, the pre-wet liquid is supplied from one pre-wet liquid nozzle 3920. The other structure, function, and structure of the substrate processing apparatuses are the same as or similar to those in FIG. 5.

Referring again to FIG. 4, the controller 900 controls the treatment liquid nozzle 910 and the pre-wet liquid nozzle 920. An embodiment in which the controller 900 controls the treatment liquid nozzle 910 and the pre-wet liquid nozzle 920 will be described in detail later.

Referring again to FIGS. 1 to 3, a bake chamber 420 treats the substrate W with heat. For example, the bake chambers 420 perform a prebake process for removing organic substances and moisture on the surface of the substrate W by heating the substrate W to a predetermined temperature before coating the photoresist or a soft bake process performed after the photoresist is coated on the substrate W, or the like, and a cooling process of cooling the substrate W after each heating step. The bake chamber 420 has a cooling plate 421 or a heating plate 422. The cooling plate 421 is provided with a cooling means 423 such as cooling water or a thermoelectric element. The heating plate 422 is also provided with a heating means 424, such as a hot wire or a thermoelectric element. The cooling plate 421 and the heating plate 422 may be provided in a single bake chamber 420, respectively. Alternatively, some of the bake chambers 420 may include only the cooling plate 421, and the other portions may include only the heating plate 422.

The developing module 402 performs a developing process for supplying a developing solution to remove a part of the photoresist to obtain a pattern on the substrate W and a heat treatment process such as heating and cooling performed on the substrate W before and after the development process. The developing module 402 has a developing chamber 460, a bake chamber 470, and a transfer chamber 480. The developing chamber 460, the bake chamber 470, and the transfer chamber 480 are sequentially disposed along the second direction 14. Therefore, the developing chamber 460 and the bake chamber 470 are positioned apart from each other in the second direction 14 with the transfer chamber 480 there between. A plurality of developing chambers 460 are provided, and a plurality of developing chambers 460 are provided in the first direction 12 and the third direction 16, respectively. A plurality of bake chambers 470 are provided in the first direction 12 and the third direction 16, respectively.

The transfer chamber 480 is arranged in a line with the second buffer 330 of the buffer module 300 in the first direction 12. A developing robot 482 and a guide rail 483 are located in the transfer chamber 480. The transfer chamber 480 has a generally rectangular shape. The developing robot 482 transfers the substrate W between the bake chambers 470, the developing chambers 460 and the second buffer 330 of the buffer module 300 and the cooling chamber 350. The guide rail 483 is arranged so that its longitudinal direction is parallel to the first direction 12. The guide rail 483 guides the developing robot 482 to move linearly in the first direction 12. The developing robot 482 has a hand 484, an arm 485, a support 486, and a pedestal 487. The hand 484 is fixed to the arm 485. The arm 485 is provided in a stretchable configuration to allow the hand 484 to move in a horizontal direction. The support 486 is provided so that its longitudinal direction is disposed along the third direction 16. The arm 485 is coupled to the support 486 so as to be linearly movable along the support 486 in the third direction 16. The support 486 is fixedly coupled to the pedestal 487. The pedestal 487 is coupled to the guide rail 483 so as to be movable along the guide rail 483.

The developing chambers 460 all have the same structure. However, the types of developing solutions used in the respective developing chambers 460 may be different from each other. The developing chamber 460 removes a region of the photoresist on the substrate W where light is irradiated. At this time, the area of the protective film irradiated with the light is also removed. Selectively, depending on the type of used photoresist, only the areas of the photoresist and protective film that are not irradiated with light may be removed.

The developing chamber 460 has a housing 461, a support plate 462, and a nozzle 463. The housing 461 has a cup shape with an open top. The support plate 462 is positioned within the housing 461 and supports the substrate W. The support plate 462 is provided rotatable. The nozzle 463 supplies the developing solution onto the substrate W supported by the support plate 462. The nozzle 463 may be provided as circular tube shape and may supply the developing solution to the center of the substrate W. Alternatively, the nozzle 463 may have a length corresponding to the diameter of the substrate W, and the discharge port of the nozzle 463 may be provided with a slit. Further, the developing chamber 460 may further be provided with a nozzle 464 for supplying a cleaning liquid such as deionized water to clean the surface of the substrate W to which the developer is supplied.

The bake chamber 470 of the developing module 402 treats the substrate W with heat. For example, the bake chambers 470 perform a post-bake process in which the substrate W is heated before the development process is performed, a hard bake process for heating the substrate W after the development process is performed, and a cooling process for cooling the heated substrate W after each baking process. The bake chamber 470 has a cooling plate 471 or a heating plate 472. The cooling plate 471 is provided with a cooling means 473 such as cooling water or a thermoelectric element. Or heating plate 472 is provided with heating means 474, such as a hot wire or a thermoelectric element. The cooling plate 471 and the heating plate 472 may be provided in one bake chamber 470, respectively. Selectively, some of the bake chambers 470 may have only a cooling plate 471, while others may only have a heating plate 472.

An interface module 700 transfers the substrate W between the coating and developing module 400 and a exposure apparatus 900. The interface module 700 has a frame 710, a first buffer 720, a second buffer 730, and an interface robot 740. The first buffer 720, the second buffer 730, and the interface robot 740 are located within the frame 710. The first buffer 720 and the second buffer 730 are spaced apart from each other by a predetermined distance and are stacked on each other. The first buffer 720 is disposed higher than the second buffer 730.

The interface robot 740 is spaced apart from the first buffer 720 and the second buffer 730 in the second direction 14. The interface robot 740 carries the substrate W between the first buffer 720, the second buffer 730 and the exposure apparatus 900.

The first buffer 720 temporarily stores the substrates W subjected to the resist coating process before they are transferred to the exposure apparatus 900. The second buffer 730 temporarily stores the processed substrates W in the exposure apparatus 900 before they are transferred to the coating and developing module 400. The first buffer 720 has a housing 721 and a plurality of supports 722. The supports 722 are disposed within the housing 721 and are provided spaced apart along the third direction 16 with respect to each other. One substrate W is placed on each support 722. The housing 721 has an opening (not shown) for loading or unloading the substrate W to the support 722 into the housing 721 of the interface robot 740. The second buffer 730 has a structure substantially similar to that of the first buffer 720. The interface module may be provided with only buffers and robots as described above without providing a chamber to perform a predetermined process on the substrate.

For convenience of explanation, the substrate treating method according to the embodiment of the present invention will be described using the substrate treating apparatus of FIG. 4.

Figure 9:
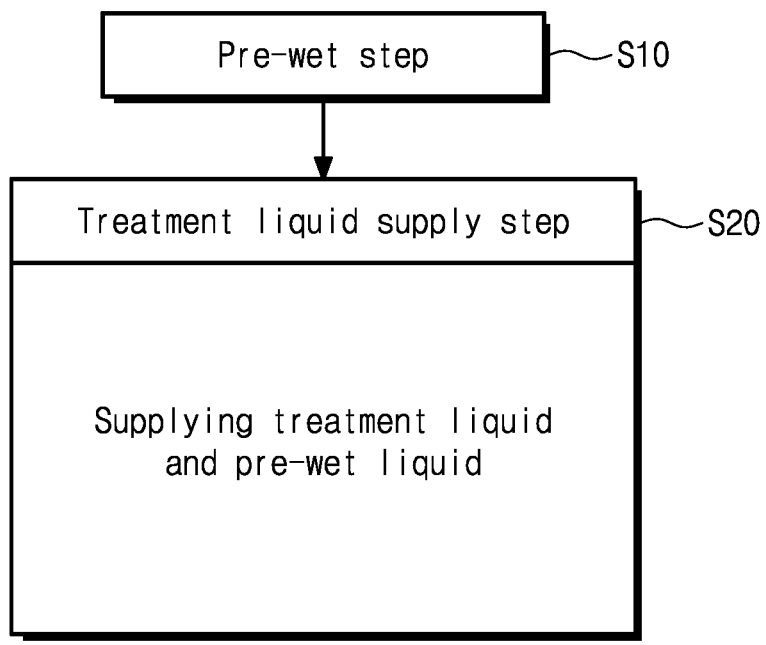
FIG. 9 is a flowchart showing a substrate treating method according to an embodiment of the present invention.

FIG. 9 is a flowchart showing a substrate treating method according to an embodiment of the present invention. Referring to FIGS. 4 and 9, a substrate treating method is a method of treating a substrate by supplying a pre-wet liquid and a treatment liquid. The substrate treating method includes a pre-wet step S10 and a treatment liquid supply step S20. For example, the controller 900 controls the treatment liquid nozzle 910 and the pre-wet liquid nozzle 920 so as to sequentially perform the pre-wet step S10 and the treatment liquid supply step S20.

Figure 10:
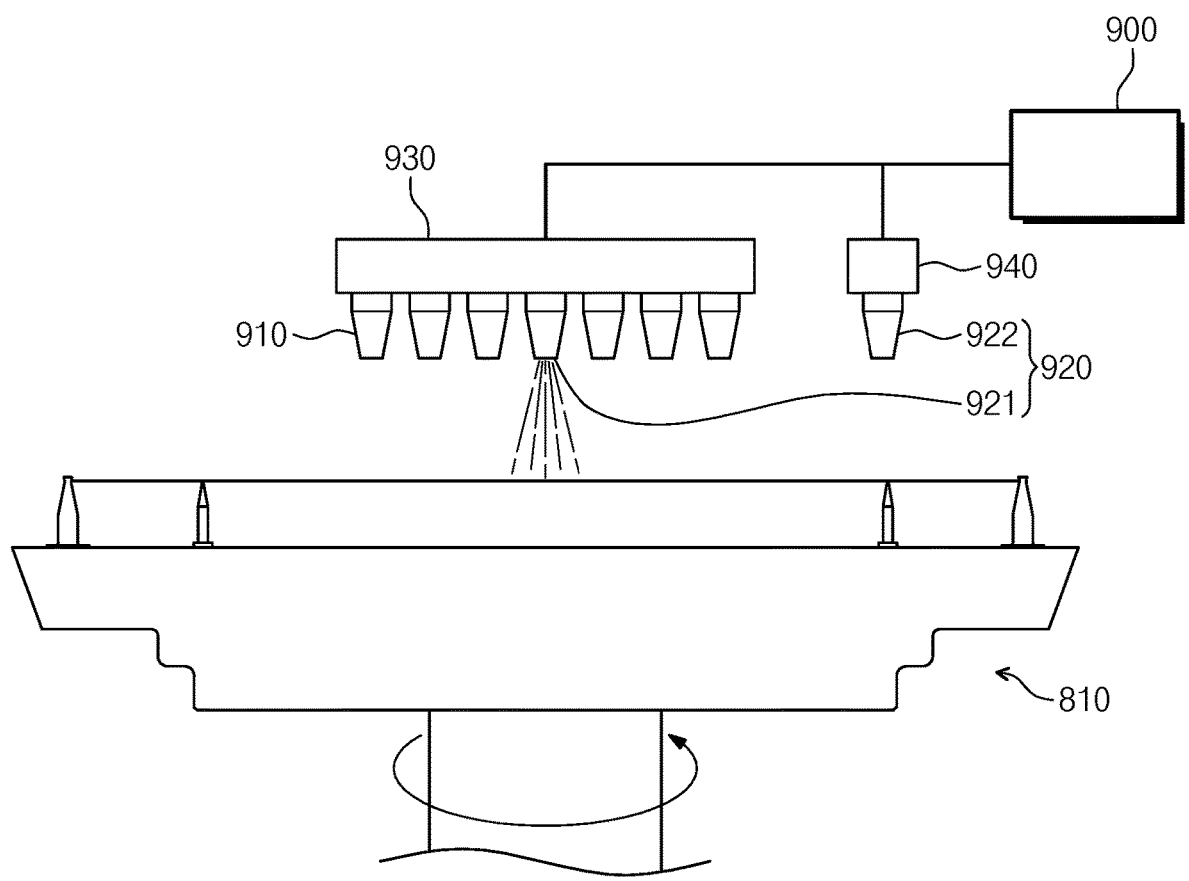
FIG. 10 is a view showing the pre-wet step of FIG. 9.

FIG. 10 is a view showing the pre-wet step of FIG. 9. Referring to FIG. 10, in the pre-wet step S10, the pre-wet liquid is supplied to the substrate W placed on the support unit 810. The pre-wet liquid then acts so that the treatment liquid to be supplied to the substrate W is easily diffused to the surface of the substrate W. For example, the controller 900 moves the first nozzle arm 930 to supply the pre-wet liquid to the central region of the substrate W on which is being rotated, preferably the center of the substrate W. Thereafter, the controller 900 controls the first pre-wet liquid nozzle 921 to supply the pre-wet liquid onto the substrate W on which is being rotated.

Figure 11:
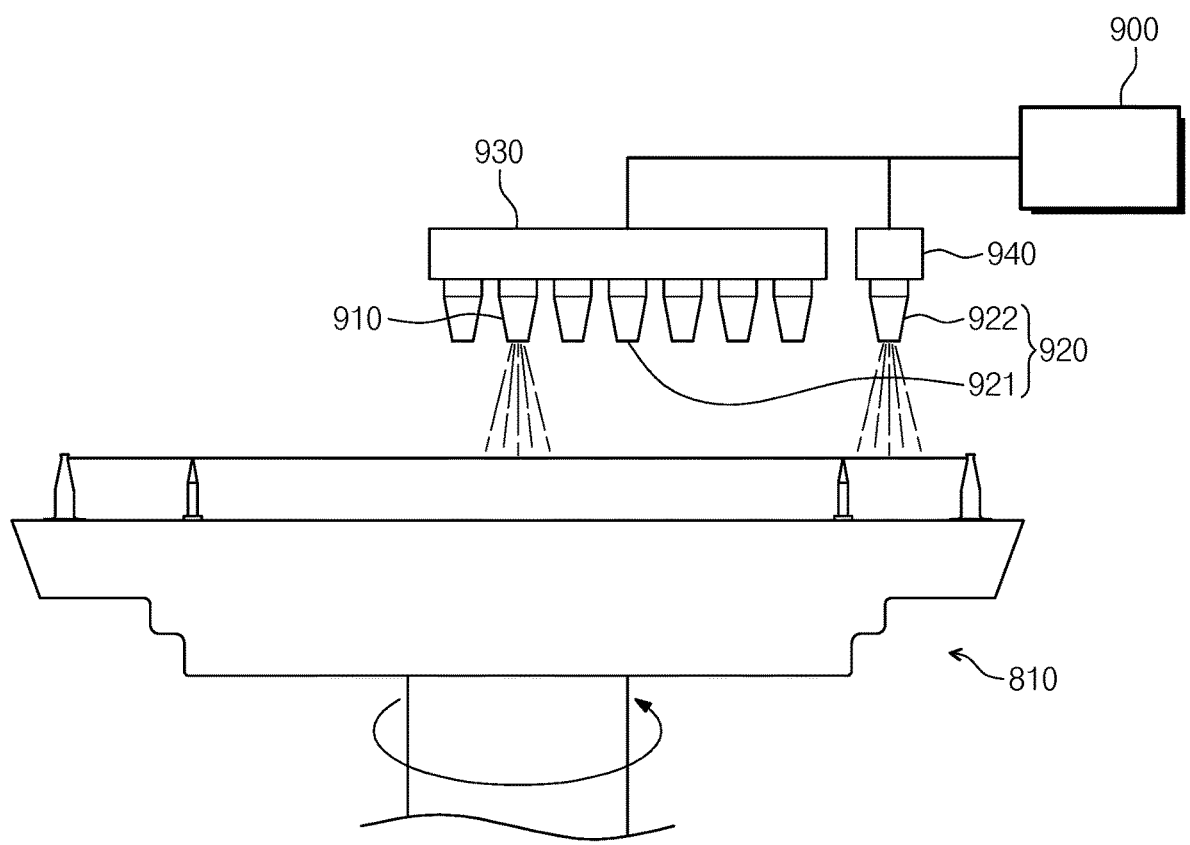
FIG. 11 is a view showing the treatment liquid supply step of FIG. 9.

FIG. 11 is a view showing the treatment liquid supply step of FIG. 9. Referring to FIG. 11, the treatment liquid supply step S20 is performed after the pre-wet step S10 is completed. In the treatment liquid supply step S20, the treatment liquid is supplied to the substrate W placed on the support unit 810 and the pre-wet liquid is supplied to the substrate W placed on the support unit 810 on the way. The position where the pre-wet liquid is supplied onto the substrate W is a position farther from the center of the substrate W than the position where the treatment liquid is supplied onto the substrate W. For example, in the treatment liquid supply step S20, the controller 900 controls the first nozzle arm 930, the second nozzle arm 940, the treatment liquid nozzle 910, the first pre-wet liquid nozzle 921, and the second pre-wet liquid nozzle 910 so that the treatment liquid is supplied to the central region of the substrate to be rotated, preferably the center of the substrate W, and the pre-wet liquid is supplied to the edge region of the substrate to be rotated.

According to one embodiment, the controller 900, in the treatment liquid supply step S20, controls the treatment liquid nozzle 910 and the pre-wet liquid nozzle 920 so that the supply of the pre-wet liquid stops before the treatment liquid reaches the point on the substrate W to which the pre-wet liquid is supplied. This is to prevent the pre-wet liquid from being supplied onto the supplied treatment liquid. Therefore, when these conditions are satisfied, selectively the controller, in the treatment liquid supply step S20, may control the treatment liquid nozzle 910 and the pre-wet liquid nozzle 920 so that the supply timing of the treatment liquid and the pre-wet liquid are the same. Alternatively, the controller 900, in the treatment liquid supply step S20, may control the treatment liquid nozzle 910 and the pre-wet liquid nozzle 920 so that the pre-wet liquid is supplied to the substrate before the treatment liquid, and the supply of the pre-wet liquid is completed before the supply of the treatment liquid. Alternatively, the controller 900, in the treatment liquid supply step S20, may control the treatment liquid nozzle 910 and the pre-wet liquid nozzle 920 so that the supply of the pre-wet liquid and the supply of the treatment liquid are completed simultaneously.

The substrate treating method according to the embodiment of the present invention has been described as being performed using the substrate treating apparatus of FIG. 4. However, the present invention is not limited thereto, and may be carried out using the substrate treating apparatus provided with the treatment liquid nozzle, the pre-wet liquid nozzle, the first nozzle arm and/or the second nozzle arm of FIGS. 6 to 8. Therefore, in each case, depending on the order, the timing and the position of supplying the treatment liquid and the pre-wet liquid in the above-described substrate treating method, the controller controls and the treatment liquid nozzle, the pre-wet liquid nozzle, the first nozzle arm and/or the second nozzle arm of each apparatus.

As described above, according to the embodiment of the present invention, the substrate treating apparatus and method of the present invention may supply the pre-wet liquid onto the substrate W during the supply of the treatment liquid onto the substrate W and prevent the pre-wet liquid from drying on the substrate W during the supply of the treatment liquid, thereby tearing of the film of the treatment liquid coated on the substrate may be prevented. In addition, since it is not required to supply a large amount of the treatment liquid in order to prevent the tearing phenomenon of the film, the amount of the treatment liquid used may be reduced.

In the embodiments of the present invention, a process and an apparatus for coating a photoresist have been described. However, the present invention is not limited to this, and may be coated to any apparatus and process for supplying a treatment liquid after pre-wet such as a spin-on hard mask (SOH) process for forming a film on a substrate by supplying a chemical.

What is claimed is:

1. A substrate treating method comprises:
a pre-wet step for supplying a pre-wet liquid to the substrate; and then a treatment liquid supply step for supplying a treatment liquid to the substrate and supplying a pre-wet liquid to the substrate during the supplying the treatment liquid to the substrate;
wherein in the treatment liquid supply step, the supply of the pre-wet liquid stops before the treatment liquid reaches the point on the substrate to which the pre-wet liquid is supplied.

2. The method of claim 1, wherein in the treatment liquid supply step, the supply timing of the treatment liquid and the pre-wet liquid are the same.

3. The method of claim 1, wherein in the treatment liquid supply step, the pre-wet liquid is supplied to the substrate before the treatment liquid.

4. The method of claim 3, wherein in the treatment liquid supply step, the supply of the pre-wet liquid is completed before the supply of the treatment liquid.

5. The method of claim 3, wherein in the treatment liquid supply step, the supply of the pre-wet liquid and the supply of the treatment liquid are completed at the same time.

6. The method of claim 1, wherein in the treatment liquid supply step, the position where the pre-wet liquid is supplied onto the substrate is a position farther from the center of the substrate than the position where the treatment liquid is supplied onto the substrate.

7. The method of claim 1, wherein in the treatment liquid supply step, the treatment liquid is supplied to a central region of the substrate, and the pre-wet liquid is supplied to an edge region of the substrate.

8. The method of claim 7, wherein in the pre-wet step, the pre-wet liquid is supplied to the central region of the substrate.

9. The method of claim 1, wherein a photo-resist is provided as the treatment liquid.

10. The method of claim 1, wherein a thinner is provided as the pre-wet liquid.

\* \* \* \* \*